(12) United States Patent
Soika et al.

(10) Patent No.: US 9,177,698 B2
(45) Date of Patent: Nov. 3, 2015

(54) ARRANGEMENT FOR ELECTRICALLY CONDUCTIVELY CONNECTING TWO SUPERCONDUCTIVE CONDUCTORS

(71) Applicant: NEXANS, Paris (FR)

(72) Inventors: Rainer Soika, Hannover (DE); Mark Stemmle, Hannover (DE)

(73) Assignee: NEXANS, Paris (FR)

( * ) Notice: Subject to any disclaimer, the term of this patent is extended or adjusted under 35 U.S.C. 154(b) by 122 days.

(21) Appl. No.: 14/021,464

(22) Filed: Sep. 9, 2013

(65) Prior Publication Data

US 2014/0080713 A1 Mar. 20, 2014

(30) Foreign Application Priority Data

Sep. 14, 2012 (EP) ..................................... 12306106

(51) Int. Cl.
| | |
|---|---|
| *H01B 12/00* | (2006.01) |
| *H01B 12/02* | (2006.01) |
| *H01L 39/02* | (2006.01) |
| *H01R 4/68* | (2006.01) |
| *H02G 15/34* | (2006.01) |
| *H01L 39/24* | (2006.01) |

(52) U.S. Cl.
CPC .............. *H01B 12/02* (2013.01); *H01L 39/02* (2013.01); *H01L 39/24* (2013.01); *H01R 4/68* (2013.01); *H02G 15/34* (2013.01); *Y02E 40/648* (2013.01)

(58) Field of Classification Search
CPC ....... H01L 39/02; H01L 39/24; H01L 39/248; H01L 39/2474; H01B 12/02; H01B 12/06; H01R 4/68; H02G 15/34; H01F 6/06; Y10S 505/927; Y02E 40/642
USPC .................. 505/220, 234, 230, 704, 925–927; 174/125.1, 84 R; 29/599
See application file for complete search history.

(56) References Cited

U.S. PATENT DOCUMENTS

| | | | | |
|---|---|---|---|---|
| 6,159,905 | A * | 12/2000 | Buzcek et al. | 505/234 |
| 6,844,064 | B1 * | 1/2005 | Ayai et al. | 428/375 |
| 7,071,148 | B1 * | 7/2006 | Selvamanickam et al. | 505/234 |
| 2009/0298696 | A1 * | 12/2009 | Otto et al. | 505/230 |

FOREIGN PATENT DOCUMENTS

| | | | | |
|---|---|---|---|---|
| JP | EP 1158543 | * 11/2000 | | H01B 13/00 |
| JP | 2007266149 | * 11/2007 | | H01F 6/06 |

* cited by examiner

*Primary Examiner* — Colleen Dunn
(74) *Attorney, Agent, or Firm* — Sofer & Haroun, LLP

(57) ABSTRACT

An arrangement for electrically conductively connecting two superconductive strip-shaped electrical conductors (1, 2) having at least approximately the same width, where the two conductors (1, 2) rest against each other with their end faces against each other in a connecting point (V). A strip (6) of superconductive material is soldered to the two conductors (1, 2), where the strip extends beyond both conductors so as to cover the connecting point (V). A strip (6) is used which has, only in the area of the connecting point (V) between the two conductors (1, 2), at least approximately the same width as the conductors, and where the strip narrows on both sides of the connecting point (V) and facing away from the connecting point (V).

5 Claims, 1 Drawing Sheet

ARRANGEMENT FOR ELECTRICALLY CONDUCTIVELY CONNECTING TWO SUPERCONDUCTIVE CONDUCTORS

RELATED APPLICATION

This application claims the benefit of priority from European Patent Application. No. 12 306 106.1, filed on Sep. 14, 2012, the entirety of which is incorporated by reference.

BACKGROUND

1. Field of the Invention

The invention relates to an arrangement for electrically conductively connecting two superconductive strip-shaped electrical conductors having at least approximately the same width, wherein the two conductors rest against each other with their end faces at a connecting point, and wherein a strip of superconductive material is soldered to both conductors which extends over both conductors so as to cover the connecting point. (Publication of American Company at AMSC from the year 2010, "Guidelines for and—Assembled Splicing of Amperium Wire," Pages 1 to 7).

2. Description of Related Art

Materials suitable for superconductive conductors are, for example, oxidic materials on the basis of rare earths (ReBCO), particularly YBCO (yttrium-barium-copper oxide) or BSCCO (bismuth-strontium-calcium-copper oxide). Magnesium boride is also known as a superconductive material. Superconductive conductors of the mentioned materials can be manufactured with relatively great length. For manufacturing superconductive cables, the conductors are wound, for example, around a core or another substrate. A conductor having the appropriate length is required for a continuous manufacture of a superconductive cable. It may then be necessary that two or more lengths of the superconductive conductor must be electrically conductively connected to each other. Such a connection of two sections of a conductor must also be carried out when a damaged portion of the conductor has to be cut out, or when the conductor tears during the manufacture.

Arrangements of this type are disclosed in the above mentioned publication of the company AMSC for superconductive conductors, in which the superconductive material is mounted on a buffer layer which is, in turn, placed on a carrier layer. Consequently, two superconductive conductors can be connected to each other by turning one of the conductors about 180° and placing its superconductive layer onto the superconductive layer of the other conductor. The two conductors are then soldered together. Another possibility is to position the two conductors with their end faces against each other and to solder a rectangular strip of superconductive material onto the two conductors, wherein the strip has at least approximately the same width as the two conductors. In both cases the connecting point between the two conductors is relatively stiff, so that the bending capability of the conductor is negatively affected.

3. Objects and Summary

The invention is based on the object of configuring the above described arrangement in such a way that the bending capability of the superconductive conductor at the connecting points is improved.

In accordance with the invention, this object is met in that a strip is used which has approximately the same width as the conductors only in the region of the connecting point between the two conductors, and becomes narrower on both sides of the connecting point facing away from the connecting point.

The two conductors are sufficiently tightly connected at their connecting point by the strip because the strip has approximately the same width as the conductors in the area of the connecting point. The bending capability of the single-piece conductor manufactured with the strip is significantly improved by the narrowing of the strip on both sides of the connecting point because due to the narrowing less material may have to be bent. Since with increasing distance from the connecting point the strip has an increasing distance from the side edges of the two conductors which are connected to each other and the danger of damage to the layers shaped around the conductor is additionally reduced, for example, during the manufacture of a superconductive cable.

Particularly advantageously the strip narrows with a conical pattern symmetrically relative to the center line of the conductor. Its ends are preferably rounded. The border areas of the strip are additionally constructed thinner than the central portion.

BRIEF DESCRIPTION OF THE DRAWINGS

An embodiment of the subject matter of the invention is illustrated in the drawings.

In the drawing.

DETAILED DESCRIPTION

The following description refers also to conductors of all other superconductive materials of the so-called second generation. with, for example, YBCO as the superconductive material representative of all these other superconductive materials. This material according to the above mentioned publication of the company AMSC is applied, for example, onto a substructure which is composed of at least a carrier layer and a buffer layer placed on the carrier layer. The superconductive material is applied to the buffer layer. It may additionally be covered by a thin protective layer of electrically conducting material such as silver. A further electrically conducting layer may be mounted above this layer which is composed, for example, of copper.

Figure 1:
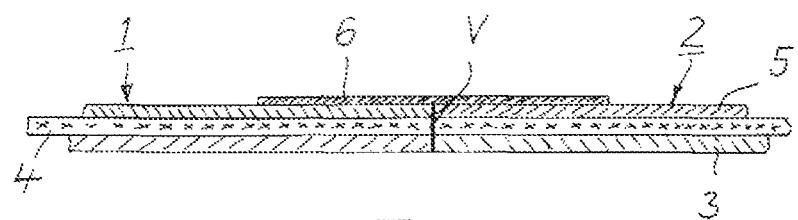
FIG. 1 is a side view of the arrangement according to the invention, in a schematic sectional view.

FIG. 1 shows a connecting point V between two superconductive strip-shaped conductors 1 and 2. The two conductors 1 and 2 should have at least approximately the same width. Each of the two conductors 1 and 2 has a carrier layer 3 which may be, for example, a biaxially textured strip of nickel, copper or iron. A buffer layer 4 each is applied to the carrier layer, wherein the buffer layer 4 may be of copper or silver. The layer 5 placed on the buffer layer 4 is of a superconductive material, for example YBCO. As already mentioned, an additional electrically conductive protective layer and another layer which is also electrically conductive may be mounted above the layer 5.

Figure 2:
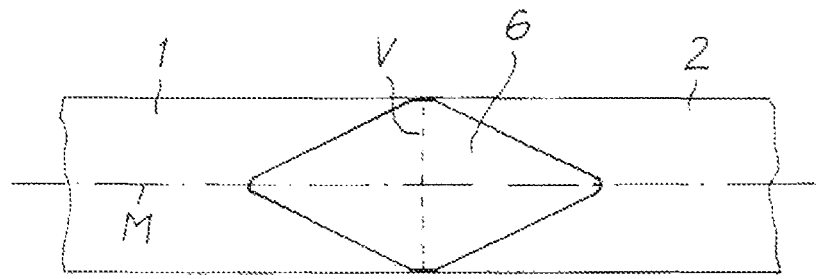
FIG. 2 is a top view of the arrangement according to FIG. 1.

The two conductors 1 and 2 are fixedly connected to each other through a strip 6 of superconductive material. For this purpose, the strip 6, whose configuration can be seen for example in FIG. 2, is soldered to the two conductors 1 and 2. Basically, it may be of the same construction as the two conductors 1 and 2 to be connected to each other. However, a differently constructed strip 6 of any chosen superconductive material may be used.

In the illustrated embodiment according to FIG. 2, the strip 6 has, in the area of the connecting point V, the same width as the conductors 1 and 2. At this location the strip should have at least approximately the same width as the conductors 1 and 2. Facing away from the connecting point V, the strip 6 is narrowed on both sides, specifically with a conical pattern advantageously symmetrical relative to the center line M of the two conductors 1 and 2. In a preferred embodiment the strip 6 is rounded at both ends as illustrated in the drawing. The strip 6 may additionally be constructed thinner in its border regions, preferably with a continuous transition, than in its central area which in the assembled state is located in the center line M of the two conductors 1 and 2. In this case, the thin border areas extend up into the "peaks" of the narrowing areas which are also thinner as a result.

The invention claimed is:

1. Arrangement for electrically conductively connecting two superconductive strip-shaped electric lines having approximately the same width, where the two conductors rest against each other with their end faces in a connecting point, and where a strip of superconductive material is soldered to both conductors, where the strip extends beyond both conductors so as to cover the connecting point, said arrangement comprises:

said strip of superconductive material having, only in the area of the connecting point between the two conductors, at least approximately the same width as conductors, and that on both sides of the connecting point the strip narrows facing away from the connecting point.

2. Arrangement according to claim 1, wherein the ends of the strip are rounded.

3. Arrangement according to claim 1, wherein the strip symmetrically narrows preferably in accordance with a conical pattern relative to the center line of the conductors.

4. Arrangement according to claim 1, wherein the strip is constructed thin in its border areas as compared to its central area located in the area of the center line of the conductors.

5. Arrangement according to claim 4, wherein the strip is constructed thin in its border areas as compared to its central area located in the area of the center line of the conductors, with continuous transition between its border areas and its central area.

* * * * *